United States Patent [19]

Pentecost

[11] 4,206,405
[45] Jun. 3, 1980

[54] VARIABLE RATE MEASURING WATT HOUR METER

[75] Inventor: Eugene E. Pentecost, Anaheim, Calif.

[73] Assignee: Rockwell International, Pittsburgh, Pa.

[21] Appl. No.: 853,177

[22] Filed: Nov. 21, 1977

[51] Int. Cl.² .................. G01R 15/08; G01R 19/16
[52] U.S. Cl. ................................. 324/116; 324/103 R
[58] Field of Search .......... 324/116, 115, 120, 103 R; 318/341, 349; 364/483

[56] References Cited

U.S. PATENT DOCUMENTS

| Re. 15,807 | 4/1924 | Holmes | 318/349 |
|---|---|---|---|
| 725,798 | 4/1903 | Thomson et al. | 324/116 |
| 3,539,893 | 11/1970 | Tong | 318/341 |
| 4,082,999 | 4/1978 | Staker | 324/116 |

Primary Examiner—Rudolph V. Rolinec
Assistant Examiner—Ernest F. Karlsen
Attorney, Agent, or Firm—R. Lewis Gable; Albert G. Marriott

[57] ABSTRACT

An improved watt-hour meter which permits time modulation of the power utilized wherein varying rates can be imposed upon the power user. The improved meter includes a substantially standard type watt-hour meter to which is added circuitry which alters the effective time during which the potential coil of the watt-hour meter is connected in circuit. Inasmuch as the power reading or indication by the meter is a function of the time during which the potential coil is connected in circuit, the effective power reading and, thus the rate structure can be selectively altered in this manner.

19 Claims, 1 Drawing Figure

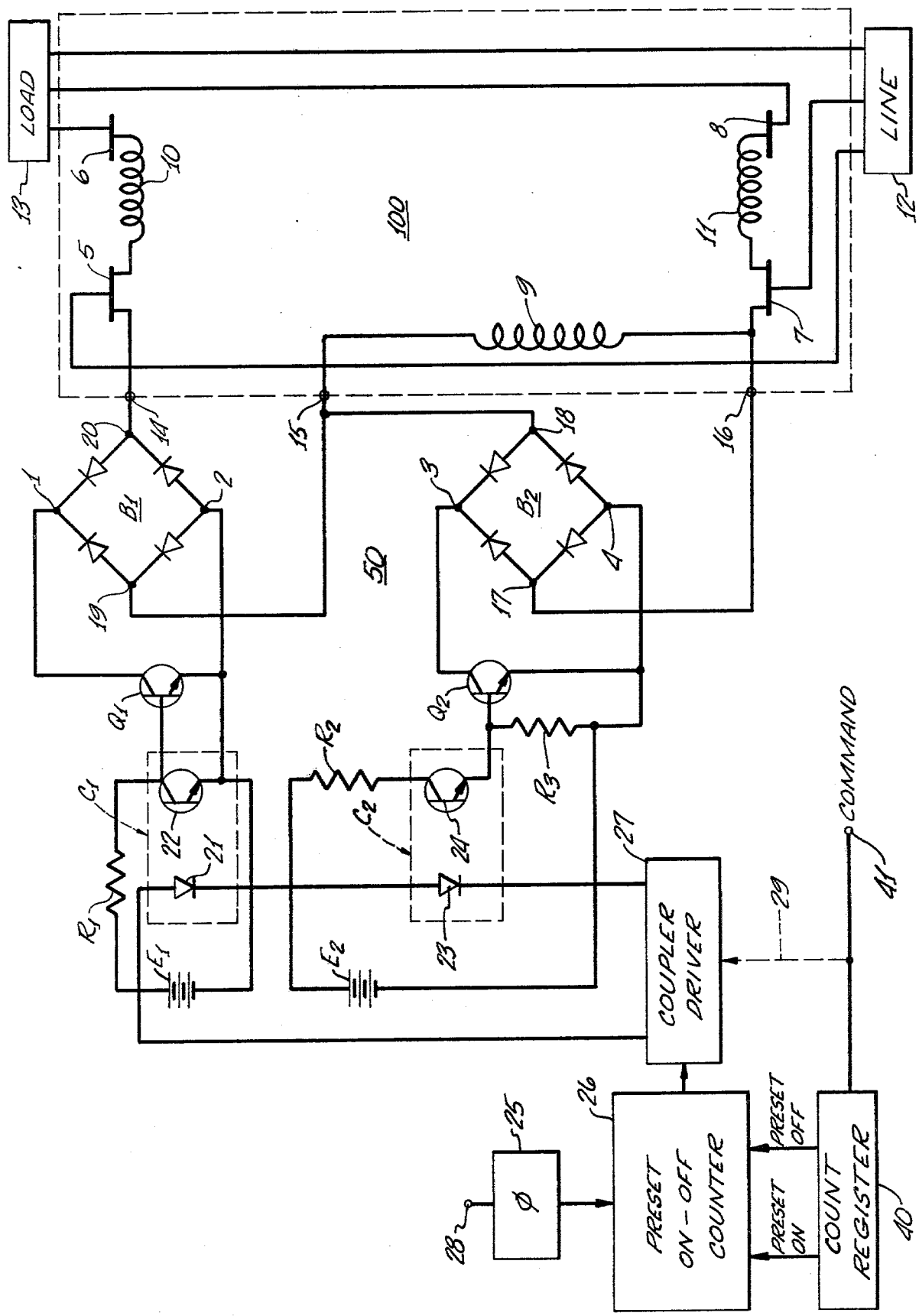

VARIABLE RATE MEASURING WATT HOUR METER

BACKGROUND

1. Field of Invention

This invention is directed to power meters, in general, and to variable-rate watt-hour meters, in particular.

2. Prior Art

There are many known types of devices for measuring power which is used by a user. Typical of these devices is a watt-hour meter of the type which has been used for many years to indicate the cumulative energy passed through electric wires or power lines. The meter is arranged to include current coils which are connected in series with the "hot" lines from the power source. A potential coil is connected across these "hot" lines. The watt-hour meter functions to read the product of voltage, current, power factor and time. This reading indicates the energy which has been used by the user and the utility or supplier merely multiplies this number by the rate number and arrives at a billing schedule. Unfortunately this technique provides a single rate schedule with little or no flexibility in billing procedures.

In the present situation of energy shortages, there has been an attempt to encourage the use of energy at off-peak hours. This would have the effect of reducing the peak load requirements and smoothing the load requirements from the utilities. As a result more uniform energy requirements are established along with a better utilization of the utility equipment. Moreover, the need for additional utility equipment for peak load periods would be reduced.

In order to encourage this more evenly distributed usage, utilities are proposing to use different billing rates as a function of the time of day. In order to establish this variable rate structure, a "time-of-day" metering is required. In this case the customer is charged at different rates for each kilowatt-hour as a function of the time at which the energy was used.

This type of rating can be obtained by using a meter which has two or more registers to accumulate kilowatt-hours during different rate periods. However, this arrangment would require a totally new kind of meter or a plurality of meters at each installation. The cost of this method, therefore, is prohibitive. Other types of metering methods have been explored but they are equally as expensive and difficult to implement.

PRIOR ART STATEMENT

The below listed U.S. Patents represent the best art known to applicant to date. Other art, not currently known to applicant may exist.

U.S. Pat. No. 3,523,248—Power Factor Measuring Device. Responsive to the ratio of Varhour Pulses to Watt-hour Pulses—Wright—Pulses produced by a watt-hour meter and a varhour meter are counted and related to each other. The power factor is determined as a function of the relationship of the counted pulses.

U.S. Pat. No. 3,525,042—Method and Apparatus For Statistically Measuring Power Consumption—Nunlist et al.—Pulse converters provide pulses which are charaterized as funtions of current and voltage in order to measure energy. The converters are connected to feed a coincidence circuit which then controls a counter.

U.S. Pat. No. 3,614,611—Voltage and Wattage Indicator for Arc Lamps—Benjamin—An open ciruict portion is connected to a voltage meter to indicate voltage across the arc lamp when it is not operating and drawing current.

U.S. Pat. No. 3,718,860—Real Time Digital Energy Meter—Kwast et al—An intergrating digital voltmeter with a selectable integration time period is connected to electronic multiplication means which produces a voltage proportional to current and voltage representing signals.

U.S. Pat. No. 3,818,340—Electronic Watt-Hour Meter with Digital Output Representing Time—Integrated Input—Yamaguchi—A watt-hour meter processes a varying amplitude input signal to produce a digital output signal. The output signal from the watt-hour meter is used to modulate a gating circuit which selectively permits a counter to be clocked such that a digital watt-hour output is provided.

U.S. Pat. No. 3,953,795—Transformerless Kilowatt-hour Meter for an Electrical Power Line—Brunner et al—First and second complementary current signals are combined in a switching means for providing a signal representative of electrical kilowatt hours.

U.S. Pat. No. 3,540,030—Structure for and Method of Powerline Remote Control—Hartz—A structure for removing remote loads from a power source in response to signals along a power line.

U.S. Pat. No. 2,000,736—Multiple Rate Power Metering—Ballantine—A meter includes a voltage coil with a plurality of taps and means for changing the taps to change the metering rate.

U.S. Pat. No. 1,138,513—Electric Meter—Stempel—A meter wherein the rotation of a rotary element is controlled by an auxlary circuit which in energized inversely proportional to the load thereon.

U.S. Pat. No. 3,683,483—Demand Metering System for Electric Energy—Feldman et al.—A variable rate metering system wherein a multi-tone control signal is supplied to receiving means to adjust meter speed.

SUMMARY OF THE INVENTION

There is provided a variable rate watt-hour meter. The present watt-hour meter can be implemented as an integral unit or as a modification to a standard watt-hour meter. The meter includes a circuit which is adapted to selectively connect the potential coil of the watt-hour meter in circuit with the remainder of the watt-hour. When the potential coil is selectively connected in circuit, the meter operates normally to measure energy therethrough. When the potential coil is not connected in circuit, it is shorted upon itself and energy is not measured. By controlling the duty cycle of the inclusion of the potential coil in circuit the watt-hour meter reading can be controlled.

The control circuit includes suitable electronic switching devices which electrically connect or short circuit the potential coil relative to the watt-hour meter structure. Through the control circuit, the duty cycle and thus the watt-hour meter reading arrangement can be selectively controlled.

BRIEF DESCRIPTION OF THE DRAWINGS

The sole FIGURE is a schematic diagram of a typical watt-hour meter including the control circuit of the instant invention.

DESCRIPTION OF A PREFERRED EMBODIMENT

Referring to the sole FIGURE there is shown a "standard" watt-hour meter 100 which is represented in schematic fashion. Watt-hour meter 100 includes current coils 10 and 11 as well as potential coil 9. Elements 5, 6, 7 and 8 represent the blades or connectors on the standard contact arrangement in a watt-hour meter of known configuration. Current coil 10 is connected between blades 5 and 6 and, thus, in series between load 13 and power line 12. Similarly, current coil 11 is connected between blades 7 and 8 and, thus, in series between power line 12 and load 13. The neutral line is connected from power line 12 to load 13 directly. Potential coil 9 is connected directly to blade 7. In a standard watt-hour meter, prior to this invention, potential coil 9 is also connected to blade 5 either directly or via a suitable link. In the configuration shown in this invention, potential coil 9 is also connected to blade 5 via the control circuitry as shown. In particular, terminals 14, 15 and 16 represent terminals which are obtainable at meter 100 and to which further connections are made.

In particular, terminal 15 is connected to bridge circuits B1 and B2 at nodes 19 and 18, respectively. In addition, terminal 16 is connected to node 17 of bridge circuit B2 while terminal 14 is connected to node 20 of bridge circuit B1. Bridge circuits B1 and B2 are shown, schematically, as diode bridge cirucits of a type known in the art. The specific configuration of the bridge circuits is not important to this invention, per se.

Node 3 of bridge circuit B2 is connected to the collector electrode of NPN transistor Q2. The emitter electrode of transistor Q2 is connected to node 4 of bridge circuit B2. The base electrode of transistor Q2 is connected to the emitter electrode of light senisitive transistor 24 and to one terminal of resistor R3. The other terminal of resistor R3 is connected to one terminal (for example, the negative pole) of source E2, which is typically a power supply, as well as the emitter electrode of transistor Q2. A positive pole of source E2 is connected via resistor R2 to the collector electrode of photo-transistor 24. Photo-transistor 24 is optically coupled to light emitting diode 23 to form optical coupling C2.

The emitter and collector electrodes of NPN transistor Q1 are connected to nodes 2 and 1 of bridge circuit B1, respectively. The emitter electrode of transistor Q1 is connected to the emitter electrode of light sensitive transistor 22. The collector electrode of transistor 22 is connected to the base electrode of transistor Q1. Resistor R1 and source E1 (typically a power supply) are connected in series between the emitter and collector electrodes of transistor 22. Source E1 is arranged to have a negative pole thereof connected to the emitter electrode of transistor 22. Light emitting diode 21 is optically coupled to the base electrode of light sensitive transistor 22 to form optical coupler C1. Light emitting diodes 21 and 23 are connected in head-to-tail series. The series connected LED's are connected to coupler driver 27 which may be of any suitable configuration. Coupler driver 27 is connected to receive a signal from preset on-off counter 26. Clock source 25 is connected to drive pre-set on-off counter 26. Input terminal 28 is provided to clock source 25 to provide electrical input signals of a suitable frequency, for example 60 Hz to establish a suitable clock frequency. Pre-set on and pre-set off signals are supplied to counter 26 by count register 40 in order to establish the on-off states described hereinafter. Command signals are applied to count register 40 via terminal 41. Optionally, input terminal 29 is connected to coupler driver 27 to permit the application of other input signals to driver 27 as described hereinafter.

Circuit 50 is, basically an electronic switch. The switch is connected to watt-hour meter 100 as shown. Very broadly, switch 50 controls the operation of potential coil 9. That is, depending upon the operation of switch 50, potential coil 9 is connected across watt-hour meter 100, i.e. between blades 5 and 7. Conversely, in the other mode of operation (established by switch 50), potential coil 9 is short circuited on itself wherein terminals 15 and 16 are effectively connected together. In essence, when potential coil 9 is connected between blades 5 and 7, watt-hour meter 100 is fully operational and provides an energy measuring system. Conversely, when potential coil 9 is shorted, watt-hour meter 100 does not record or measure the energy utilized but does permit current to flow from the power line 12 to load 13.

In typical operation, transistor Q1 is maintained in the on or conductive condition as a result of the signal supplied by source E1 via resistor R1. When the transistor Q1 is operative, nodes 1 and 2 of bridge circuit B1 are shorted together. As a result, bi-directional current can pass through bridge circuit B1 from terminal 15 to terminal 14 (or vice versa). Potential coil 9 is therefore, effectively connected across the input voltage line (typically a 240 volt line). As a result watt-hour meter 100 functions to measure the energy passing therethrough.

It should be noted, that concurrently, transistor Q2 is typically biased in the off or non-conduction state due to the arrangement of source E2 in conjunction with bias resistors R2 and R3. This arrangement can be classified as the standard or operating condition.

Conversely, when a signal is supplied by coupler driver 27 light emitting transistors 21 and 23 are energized to produce radiation, typically in the form of light, infra red radiation (IR) of the like. This radiation impinges upon light sensitive transistors 22 and 24 to the extent that each of these transistors is rendered conductive. When transistor 22 is rendered conductive, the current in Resistor R1 and across the base-emitter junction of transistor Q1 is shunted to the emitter of transistor Q1 whereby this latter transistor is effectively turned off. When transistor Q1 is rendered non-conductive, nodes 1 and 2 are disconnected wherein bridge R1 becomes an open circuit such that potential coil 9 is effectively disconnected from terminal 14 and, thus from blade 5. Therefore, meter 100 is not able to produce a power or energy utilization reading.

In addition, the energization of light emitting diode 23 causes transistor 24 to be turned on such that a bias current is supplied to transistor Q2 such that this transistor is turned on. When transistor Q2 is turned on, nodes 3 and 4 of bridge circuit B2 are shorted together wherein bi-directional current can exist in bridge B2. When bridge B2 is thus connected, nodes 17 and 18 effectively connect terminals 15 and 16 of meter 100 such that potential coil 9 is shorted upon itself. With this arrangement, it is clear that potential coil 9 is either connected in circuit or is short circuited. In no event is potential coil 9 floating.

Thus, it is seen that when a signal is supplied by coupler driver 27, the operational function of meter 100 is altered. When the signal supplied by driver 27 terminates, light emitting diodes 21 and 23 are no longer energized wherein the initial conditions noted above are restored. In this case, meter 100 returns to the energy measuring status described initially.

Thus, it is seen that by controlling the operation of circuit 50 the operation of meter 100 can be controlled. This arrangement permits a time modulated watt-hour meter arrangement. That is, by controlling the on-off status of meter 100 an effective rate changing ability is provided. For example, if the off-peak rate for energy is one-half the rate of the peak energy rate, meter 100 can be operated at a 50% duty cycle. That is, meter 100 reads one-half the actual energy utilized during the off-peak hours and the same rate or charge can be applied. Similarly, if the rate differential is 10:1, the meter operates on a 10% duty cycle during the low rate billing period. Thus, a meter with a single register or reading capability can be utilized to provide variable billing rates for the user.

The billing rate can be controlled as a function of signals supplied to circuit 50 via coupler driver 27. In one example, coupler driver 27 is driven by counter 26. Pre-set counter 26 can be set in any suitable manner such as manually, or the like, to provide a pre-set on and a pre-set off condition. In the manual setting, switches can be appropriately set. A suitable signal such as a 60 Hz voltage signal is supplied to clock device 25. The signal can be phase shifted in clock 25 by a suitable phase shifting network. Typically, this adjustment is set at 90°. The signals are supplied to counter 26. When a pre-set number of the input signals at terminal 28 have been counted, pre-set counter 26 produces a signal which is supplied to coupler driver 27. Coupler driver 27 then takes the appropriate action relative to providing a signal to circuit 50.

Similarly, when pre-set counter 26 reaches the appropriate count described by the pre-set off condition, counter 26 supplies a signal to coupler driver 27, which, again, takes the appropriate action relative to circuit 50. It is obvious to those skilled in the art that this arrangement results in the on time and the off time being integral periods of the 60 Hz, or clock signal, supplied to terminal 28. It is equally obvious they may be also integral ½ periods of the clock signal applied to terminal 28. Thus, it is seen that pre-set counter 26 can be controlled by pre-setting a signal count therein at the factory or by field service personnel. The decision to use this count or 100% duty cycle may be controlled by a time clock. However, that is subject to error in event of a power outage. Conversely, the control signals can be supplied to counter 26 over the power lines themselves e.g. lines 12, or by radio or the like.

If a more versatile system is desired, both the count signal and the command signal can be transmitted sequentially, over the power lines or by radio. The preset count can be stored in count register 40 and the command signal can produce the effect noted above. In point of fact, this arrangement can provide for a multiple billing rate in that the duty cycle can be controlled more accurately and changed from time-to-time in the system.

The invention of the instant system has been built and tested. In tests wherein adjustment of the current from 0 to over 100 amp was possible, excellent results were achieved. That is, ratios of "on-to-on plus off" time were utilized at different current levels. Significant data were taken primarily at 30 and 100 amperes with unity and a 0.5 power factor (leading) which was generated by use of a capacitor in series with the primary winding of the transformer supplying the current coils. At 30 amp line current, unity power factor and billing rates of 0.2, 0.4, 0.8 and 1.0, the errors in measuring the energy were well under 0.2% with errors as low as 0.5% and less being detected. In tests conducted with 100 amp line current and unity factors and the same rates, errors of less than 0.6% and as low as 0.04% and less were detected.

Thus, there has been shown and described an improved watt-hour meter which has variable billing capability included therein. While a preferred embodiment has been described, it should be clear to those skilled in the art, the modifications thereto can be made which fall within the perview of the instant description. For example, it is possible that the shorting means i.e. bridge circuits, need not be be-directional. In this case, switching off of the meter can be accomplished at a time when the current is always in the same direction. The special case of switching off at the time the current in the potential coil is at a transient zero value need not be followed by shorting. In this case, no current would flow in the short and, therefore, it is not necessary. Other modifications along this line will be apparent to those skilled in the art. For example the optical couplings need not be limited to the devices shown and described. In addition, it is possible that the count signals can be effected in a one-way or two-way communication system over the power distribution line, or, by a radio communication link or the like as desired. The watt-hour meter described herein permits a relatively simple method for achieving domestic time-of-day metering while maintaining the present investment in watt-hour meters. Also this approach is relatively simple for field service personnel to install and service, and permits ready adaptation to any suitable type of communication to obtain sophisticated rate structures in the meter system.

The metering system and or watt-hour meter described herein is intended to be illustrative only. The description is not intended to be limitative. The scope of the invention is defined only by the scope of the claims appended hereto.

Having thus described the declared embodiment of the invention, what is claimed is:

1. A variable rate, alternating current watt-hour meter for measuring the power flowing on a line at a selected one of first and second rates, said meter including, a time modulated potential coil through which alternating current flows, modulating means for selectively connecting and disconnecting said potential coil to the line, and control means for controlling said modulating means to selectively connect and disconnect said potential coil to and from the line for first and second duty ratios corresponding respectively to said first and second rates.

2. The watt-hour meter recited in claim 1 wherein said modulating means comprises switching circuit means for alternately connecting said potential coil to said line and short circuiting said potential coil.

3. The watt-hour recited in claim 2 wherein said switching circuit means includes;

first bridge circuit means connected across said potential coil, second bridge circuit means connected in series with said potential coil, and switch means connected to render said first and second bridge circuit means mutually exclusively conductive.

4. The watt-hour meter recited in claim 1 wherein;
said control means includes counter means for establishing prescribed conditions and detecting the achievement thereof whereupon control signals are produced.

5. The watt-hour meter recited in claim 4 including;
driver means connected between said counter means and said switching circuit means.

6. The watt-hour meter recited in claim 4 including;
source means for sypplying signals to said counter means which signals are representative of said prescribed conditions.

7. The watt-hour meter recited in claim 6 including;
limit means for establishing count limits as prescribed conditions in said counter means,
said counter means responsive to signals from said source means to produce output signals which are a function of the count in said counter means,
said output signals supplied from said counter means to said switching means to control the connection of said potential coil.

8. The watt-hour meter recited in claim 1 wherein;
said modulating means operates on a cyclic basis of the electrical signal imposed upon the line and connects said potential coil into the watt-hour meter on integral multiples of $\frac{1}{2}$ cycles.

9. The watt-hour meter recited in claim 1 wherein,
said control means includes cyclic signal supplying means responsive to the electrical signal imposed on the line;
said signal supplying means providing signals for controlling the connection of said potential coil into said watt-hour meter to establish on-off conditions.

10. The watt-hour meter recited in claim 9 wherein
said signal supplying means provide cyclic voltage signals wherein the on-off conditions of the watt-hour meter are controlled to a phase point in said cyclic voltage signal.

11. The watt-hour meter recited in claim 10 wherein;
said phase point in said cyclic voltage signal is 90°.

12. The watt-hour meter recited in claim 10 wherein;
said phase point is the time at which the current in said potential coil is zero.

13. The watt-hour meter recited in claim 10 wherein,
said phase point is adjusted to an optimum phase position.

14. A variable rate watt-hour meter for measuring the power flowing on a line at a selected one of first and second rates, said meter including;
a time modulated potential coil;
modulatory means comprising switching circuit means for selectively connecting said potential coil to the line and otherwise short circuiting said potential coil, said switching circuit means includes first bridge circuit means connected across said potential coil, second bridge circuit means connected in series with said potential coil, and switch means connected to render said first and second bridge circuit means mutually exclusively conductive, said switch means includes first and second transistors connected to said first and second bridge circuit means respectively, first and second energy coupled devices connected to control the conduction of said first and second transistors, respectively; and
control means connected to said first and second energy coupled devices for controlling said modulatory means to selectively connect and disconnect said potential coil to and from the line for first and second duty ratios corresponding respectively to said first and second rates.

15. Apparatus for adaping a watt hour meter including a potential coil, for measuring the power flowing on a line selectively at a selected one of first and second rates, said apparatus comprising:
 (a) switch means for selectively connecting said potential coil to a line, and for disconnecting said potential coil from the line, while short circuiting said potential coil; and
 (b) control means for controlling said switch means to disconnect and connect said coil from and to the line for one of first and second duty ratios, whereby said meter measures the power at the selected one of the first and second rates.

16. A variable rate watt hour meter for measuring the power flowing on a line at a selected one of first and second rates, said meter including:
 (a) a potential coil;
 (b) switch means operable in a first mode to connect said potential coil to the line, and operative in a second mode to disconnect said potential from the line and to short circuit said potential coil; and
 (c) control means for controlling said switch means to be alternatively operative in its first and second mode at a selected one of first and second duty ratios, whereby said meter measures the power on the line corresponding to the selected one of the first and second rates.

17. The meter as claimed in claim 16, wherein said control means comprises means for providing a reference clock signal synchronizing said switch means to be operative in its first and second modes to the reference clock signal.

18. The meter as claimed in claim 17, wherein the reference clock signal comprises the electrical power signal imposed on the line.

19. The watt-hour meter recited in claim 14 wherein;
said energy coupled devices include an energy emitting device and an energy sensitive device.

* * * * *